United States Patent
Cheng et al.

(10) Patent No.: US 8,754,461 B2
(45) Date of Patent: Jun. 17, 2014

(54) SPACER ISOLATION IN DEEP TRENCH

(71) Applicant: International Business Machines Corporation, Armonk, NY (US)

(72) Inventors: Kangguo Cheng, Schenectady, NY (US); Joseph Ervin, Wappingers Falls, NY (US); Chengwen Pei, Danbury, CT (US); Ravi M. Todi, San Diego, CA (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/905,204

(22) Filed: May 30, 2013

(65) Prior Publication Data
US 2013/0328161 A1    Dec. 12, 2013

Related U.S. Application Data

(62) Division of application No. 13/489,572, filed on Jun. 6, 2012.

(51) Int. Cl.
*H01L 29/94* (2006.01)

(52) U.S. Cl.
USPC ............ 257/301; 257/E21.396; 438/243

(58) Field of Classification Search
USPC ......... 438/392, 243, 244, 245, 246, 247, 248, 438/249, 386, 387, 388, 389, 390, 391; 257/301, 302, 303, 304, 305, E21.396
See application file for complete search history.

(56) References Cited

U.S. PATENT DOCUMENTS

| | | | |
|---|---|---|---|
| 5,264,716 A | 11/1993 | Kenney | |
| 5,395,786 A | 3/1995 | Hsu et al. | |
| 5,482,883 A | 1/1996 | Rajeevakumar | |
| 5,930,585 A | 7/1999 | Coronel et al. | |
| 6,008,104 A | 12/1999 | Schrems | |
| 6,271,142 B1 | 8/2001 | Gruening et al. | |
| 6,303,413 B1 | 10/2001 | Kalnitsky et al. | |
| 6,566,177 B1 | 5/2003 | Radens et al. | |
| 6,657,276 B1 | 12/2003 | Karlsson et al. | |
| 6,734,059 B1 | 5/2004 | Hummler | |
| 6,833,305 B2 | 12/2004 | Mandelman et al. | |
| 6,919,255 B2 | 7/2005 | Birner et al. | |
| 6,984,569 B2 | 1/2006 | Karlsson et al. | |
| 7,122,437 B2 | 10/2006 | Dyer et al. | |
| 7,195,973 B2 | 3/2007 | Seidl | |
| 7,436,023 B2 | 10/2008 | Hirler et al. | |
| 7,679,130 B2 | 3/2010 | Tilke et al. | |
| 7,888,722 B2 * | 2/2011 | Cheng et al. | 257/301 |

(Continued)

*Primary Examiner* — Matthew W Such
*Assistant Examiner* — Samuel Lair
(74) *Attorney, Agent, or Firm* — L. Jeffrey Kelly; Matthew C. Zehrer

(57) ABSTRACT

A method of forming improved spacer isolation in deep trench including recessing a node dielectric, a first conductive layer, and a second conductive layer each deposited within a deep trench formed in a silicon-on-insulator (SOI) substrate, to a level below a buried oxide layer of the SOI substrate, and creating an opening having a bottom surface in the deep trench. Further including depositing a spacer along a sidewall of the deep trench and the bottom surface of the opening, and removing the spacer from the bottom surface of the opening. Performing at least one of an ion implantation and an ion bombardment in one direction at an angle into an upper portion of the spacer. Removing the upper portion of the spacer from the sidewall of the deep trench. Depositing a third conductive layer within the opening.

20 Claims, 5 Drawing Sheets

(56) References Cited

U.S. PATENT DOCUMENTS

| | | |
|---|---|---|
| 7,993,985 B2 * | 8/2011 | Shih et al. .................. 438/142 |
| 8,008,160 B2 | 8/2011 | Cheng et al. |
| 8,021,943 B2 | 9/2011 | Botula et al. |
| 2004/0065914 A1 * | 4/2004 | Koike et al. .................. 257/301 |
| 2006/0084223 A1 | 4/2006 | Seidl |
| 2007/0032032 A1 * | 2/2007 | Heineck et al. .............. 438/386 |
| 2007/0246763 A1 * | 10/2007 | Chung ........................ 257/301 |
| 2008/0284021 A1 * | 11/2008 | Anderson et al. ............ 257/751 |
| 2009/0184392 A1 * | 7/2009 | Cheng et al. ................. 257/532 |
| 2011/0021001 A1 * | 1/2011 | Srinivasan et al. ........... 438/386 |
| 2011/0217832 A1 | 9/2011 | Raorane et al. |
| 2012/0302020 A1 * | 11/2012 | Doris et al. .................. 438/243 |
| 2013/0328157 A1 * | 12/2013 | Cheng et al. ................. 257/506 |

* cited by examiner

SPACER ISOLATION IN DEEP TRENCH

This application is a divisional of U.S. patent application Ser. No. 13/489,572, entitled SPACER ISOLATION IN DEEP TRENCH, filed on Jun. 6, 2012, which is incorporated by reference in its entirety.

BACKGROUND

1. Field of the Invention

The present invention relates generally to semiconductor memory devices, and, more particularly, to an improved method for forming a deep trench structure having an improved spacer isolation.

2. Background of Invention

Capacitors may be found in a variety of semiconductor circuits. In general, capacitors include two electrodes separated by some barrier (e.g. node dielectric) used to isolate the two electrodes from one another. As the physical size of these devices continue to shrink, the need for perfect isolation between the capacitor electrodes becomes increasingly more important. A deep trench capacitor may be formed in a bulk SOI substrate. The bulk SOI substrate may have an SOI layer stacked on top of a buried oxide layer and the buried oxide layer stacked on top of a base substrate. The base substrate generally being n-doped silicon and the SOI layer generally being p-doped silicon. A pad layer may also be located atop the bulk SOI substrate. Deep trench capacitors may be formed through the pad layer and into all layers of the bulk SOI substrate. Therefore the base substrate may act as one of the capacitor's two electrodes while a conductive layer may act as the other electrode. Isolation between the base substrate and the conductive layer may be critical.

A short circuit may result should any portion of the node dielectric be removed from below the BOX layer because a barrier would no longer insulate the base substrate from the conductive layer. Therefore, the recess depth of the polysilicon may directly affect whether the deep trench capacitor functions properly or fails due to a short circuit. Current processing techniques are imperfect. Recess depth control may be one challenge in fabricating deep trench capacitors in SOI substrates. These challenges may be further magnified as the semiconductor structures continue to decrease in size.

SUMMARY

According to one embodiment of the present invention, a method is provided. The method may include recessing a node dielectric, a first conductive layer, and a second conductive layer each deposited within a deep trench formed in a silicon-on-insulator (SOI) substrate. The node dielectric, the first conductive layer, and the second conductive layer are recessed to a level below a buried oxide layer of the SOI substrate and creating an opening having a bottom surface in the deep trench. The method further including depositing a spacer along a sidewall of the deep trench and the bottom surface of the opening, and removing the spacer from the bottom surface of the opening. Performing at least one of an ion implantation and an ion bombardment in one direction at an angle into an upper portion of the spacer. The upper portion extending from a top of the deep trench to a location between a top surface and a bottom surface of the buried oxide layer. Removing the upper portion of the spacer from the sidewall of the deep trench. Depositing a third conductive layer within the opening.

According to another exemplary embodiment of the present invention, a structure is provided. The structure may include a deep trench extending into a silicon-on-insulator (SOI), the deep trench comprising a sidewall, a top, and a bottom. A node dielectric located below a buried oxide layer and adjacent to the sidewall and the bottom of the deep trench. A first conductive layer located directly on top of the node dielectric. A second conductive layer located directly on top of the first conductive layer, wherein the second conductive layer fills the deep trench to a level at or below the first conductive layer. A spacer located along the sidewall of the deep trench and extending from a location between a top surface and a bottom surface of the buried oxide layer to the node dielectric located below the buried oxide layer. A third conductive layer located on top of the first conductive layer, the second conductive layer, and the spacer, wherein the third conductive layer fills the deep trench to a level equal with the top of the deep trench.

BRIEF DESCRIPTION OF THE SEVERAL VIEWS OF THE DRAWINGS

The following detailed description, given by way of example and not intend to limit the invention solely thereto, will best be appreciated in conjunction with the accompanying drawings, in which:

FIG. 1A depicts a deep trench filled with a node dielectric, a first conductive layer, and a second conductive layer according to an exemplary embodiment.

FIG. 1B depicts a step of forming the improved spacer where a portion of the node dielectric, first conductive layer, and second conductive layer are removed according to an exemplary embodiment.

FIG. 1C depicts a step of forming the improved spacer where the spacer is deposited according to an exemplary embodiment.

FIG. 1D depicts a step of forming the improved spacer where a portion of the spacer is removed according to an exemplary embodiment.

FIG. 1E depicts a step of forming the improved spacer where an ion implantation or ion bombardment process is directed at a portion of the spacer causing structural damage to the spacer according to an exemplary embodiment.

FIG. 1F depicts a step of forming the improved spacer where the portion of the spacer damaged by the ion implantation or ion bombardment process is removed according to an exemplary embodiment.

FIG. 1G depicts a step of forming the improved spacer where a third conductive layer is deposited to fill the remaining opening in the deep trench structure according to an exemplary embodiment.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Referring now to FIGS. 1A-1G exemplary process steps of forming an improved spacer in a deep trench structure in accordance with one embodiment of the present invention is shown. Specifically, a pad layer may first be formed over an SOI substrate prior to patterning. Using standard processes, one or more deep trench areas may then be formed in the structure. A node dielectric can then be formed over the deep trench area. A first conductive layer followed by a second conductive layer may then be deposited on top of the node dielectric. An etching process may then be performed to recess the node dielectric, the conductive layer, and the second conductive layer to a predetermined level below a buried oxide (BOX) layer. Next, a spacer may be deposited and an angled ion bombardment or ion implantation process can be performed to remove a portion of the spacer from one or both sides of the deep trench. Finally, a third conductive layer may be deposited within the remaining trench opening.

Figure 1A:
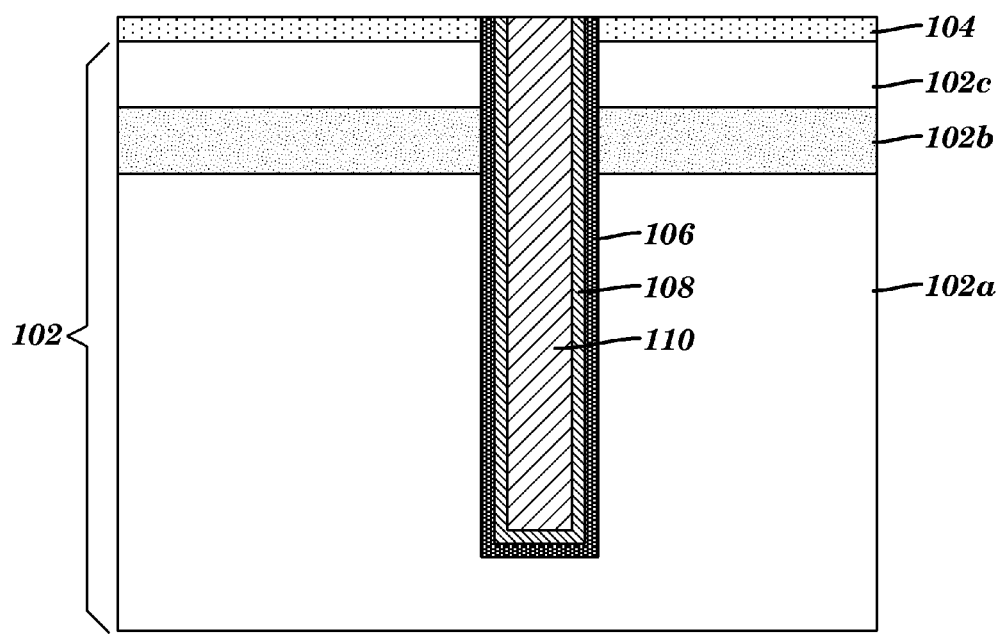
FIGS. 1A-1G illustrate the steps of a method of forming an improved spacer in a deep trench structure.

Referring now to FIG. 1A, a deep trench may be formed in a silicon-on-insulator substrate 102. The SOI substrate 102 may include a base substrate 102a, a buried oxide (BOX) layer 102b formed on top of the base substrate 102a, and a SOI layer 102c formed on top of the BOX layer 102b. The BOX layer 102b isolates the SOI layer 102c from the base substrate 102a. In addition, the SOI substrate 102 may have a pad nitride layer 104 formed on a top surface of the SOI layer 102c. The base substrate 102a may be made from any of several known semiconductor materials such as, for example, a bulk silicon substrate. Other non-limiting examples include silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically the base substrate 102a may be about, but is not limited to, several hundred microns thick. For example, the base substrate 102a may include a thickness ranging from 0.5 mm to about 1.5 mm.

The BOX layer 102b may be formed from any of several dielectric materials. Non-limiting examples include, for example, oxides, nitrides and oxynitrides of silicon. Oxides, nitrides and oxynitrides of other elements are also envisioned. In addition, the BOX layer 102b may include crystalline or non-crystalline dielectric material. Moreover, the BOX layer 102b may be formed using any of several methods. Non-limiting examples include ion implantation methods, thermal or plasma oxidation or nitridation methods, chemical vapor deposition methods and physical vapor deposition methods. In one embodiment, the BOX layer 102b may be about 150 nm thick. Alternatively, the BOX layer 102b may include a thickness ranging from about 10 nm to about 500 nm.

The SOI layer 102c may include any of the several semiconductor materials included in the base substrate 102a. In general, the base substrate 102a and the SOI layer 102c may include either identical or different semiconducting materials with respect to chemical composition, dopant concentration and crystallographic orientation. In one particular embodiment of the present invention, the base substrate 102a and the SOI layer 102c include semiconducting materials that include at least different crystallographic orientations. Typically the base substrate 102a or the SOI layer 102c include a {110} crystallographic orientation and the other of the base substrate 102a or the SOI layer 102c includes a {100} crystallographic orientation. Typically, the SOI layer 102c includes a thickness ranging from about 5 nm to about 100 nm. Methods for making the SOI layer 102c are well known in the art. Non-limiting examples include SIMOX (Separation by Implantation of Oxygen), wafer bonding, and ELTRAN® (Epitaxial Layer TRANsfer).

The pad nitride layer 104 may include an insulating material such as, for example, silicon nitride. The pad nitride layer 104 may be formed using conventional deposition methods, for example, low-pressure chemical vapor deposition (LPCVD). The pad nitride layer 104 may have a thickness ranging from about 10 nm to about 500 nm. In one particular embodiment, the pad nitride layer 104 may be about 100 nm thick. Optionally, a thin (2 nm to 10 nm, preferably 5 nm) thermal oxide layer (not shown) may be formed on the SOI layer 102c prior to forming the pad nitride layer 104.

With continued reference to FIG. 1A, a cell location is identified and a mask layer (not shown) of a suitable masking material is deposited on the pad nitride layer 104 and patterned using a conventional photolithographic techniques. The mask layer includes suitable masking materials such as, for example, photoresist or hardmask such as silicon dioxide. The deep trench may be formed by etching through the pad nitride layer 104 and the SOI substrate 102 as illustrated by the figure. The deep trench can be formed using, for example, an anisotropic dry etch technique, such as reactive ion etching (RIE). The mask layer may be removed after the deep trench is formed or, alternatively, in a later process. A node dielectric 106 (e.g. oxide, nitride, oxynitride and/or high-k materials) can be formed about the deep trench by any suitable process such as thermal oxidation thermal nitridation, atomic layer deposition (ALD), chemical vapor deposition (CVD), etc. The node dielectric 106 may have a thickness ranging from about 3 nm to 20 nm, although a thickness of the node dielectric 106 less than 3 nm or greater than 20 nm may be conceived. In one embodiment, the node dielectric 106 includes HfSiO$_x$ deposited by ALD. In one embodiment, the node dielectric 106 includes HfO$_x$ deposited by ALD. A first conductive layer 108 may then be deposited on the surface of the node dielectric 106. The first conductive layer 108 may have a thickness ranging from about 2 nm to 10 nm, although a thickness of the first conductive layer 108 less than 2 nm or greater than 10 nm may be conceived. The node dielectric 106 serves as a barrier to prevent a short circuit between the base substrate 102a and the first conductive layer 108.

The first conductive layer 108 may include any suitable conductive material, including but not limited to, doped polycrystalline or amorphous silicon, germanium, silicon germanium, a metal (e.g., tungsten, titanium, tantalum, ruthenium, zirconium), a conducting metallic compound material (e.g., tantalum nitride, titanium nitride, tungsten silicide, tungsten nitride, titanium nitride, tantalum nitride), carbon nanotube, conductive carbon, or any suitable combination of these materials. The first conductive layer 108 can be deposited by any suitable methods, including but not limited to, atomic layer deposition (ALD), chemical vapor deposition (CVD), low-pressure chemical vapor deposition (LPCVD), ultrahigh vacuum chemical vapor deposition (UHVCVD), metalorganic chemical vapor deposition (MOCVD), physical vapor deposition, sputtering, plating, evaporation, spin-on-coating, ion beam deposition, electron beam deposition, laser assisted deposition, and chemical solution deposition. In one particular embodiment, the first conductive layer 108 includes doped polysilicon deposited by LPCVD.

Next, a second conductive layer 110 may be deposited on the surface of the first conductive layer 108 and fill any remaining opening in the deep trench. The second conductive layer 110 may have a thickness ranging from about 5 nm to 50 nm, although a thickness of the second conductive layer 110 less than 5 nm or greater than 50 nm may be conceived. The second conductive layer 110 may include any suitable conductive material, including but not limited to, doped polycrystalline or amorphous silicon, germanium, silicon germanium, a metal (e.g., tungsten, titanium, tantalum, ruthenium, zirconium), a conducting metallic compound material (e.g., tantalum nitride, titanium nitride, tungsten silicide, tungsten nitride, titanium nitride, tantalum nitride), carbon nanotube, conductive carbon, or any suitable combination of these materials. The second conductive layer 110 can be deposited by any suitable methods, including but not limited to, atomic layer deposition (ALD), chemical vapor deposition (CVD), low-pressure chemical vapor deposition (LPCVD), ultrahigh vacuum chemical vapor deposition (UHVCVD), metalorganic chemical vapor deposition (MOCVD), physical vapor deposition, sputtering, plating, evaporation, spin-on-coating, ion beam deposition, electron beam deposition, laser assisted deposition, and chemical solution deposition. In one particular embodiment, the second conductive layer 110 includes doped polysilicon deposited by LPCVD.

Figure 1B:
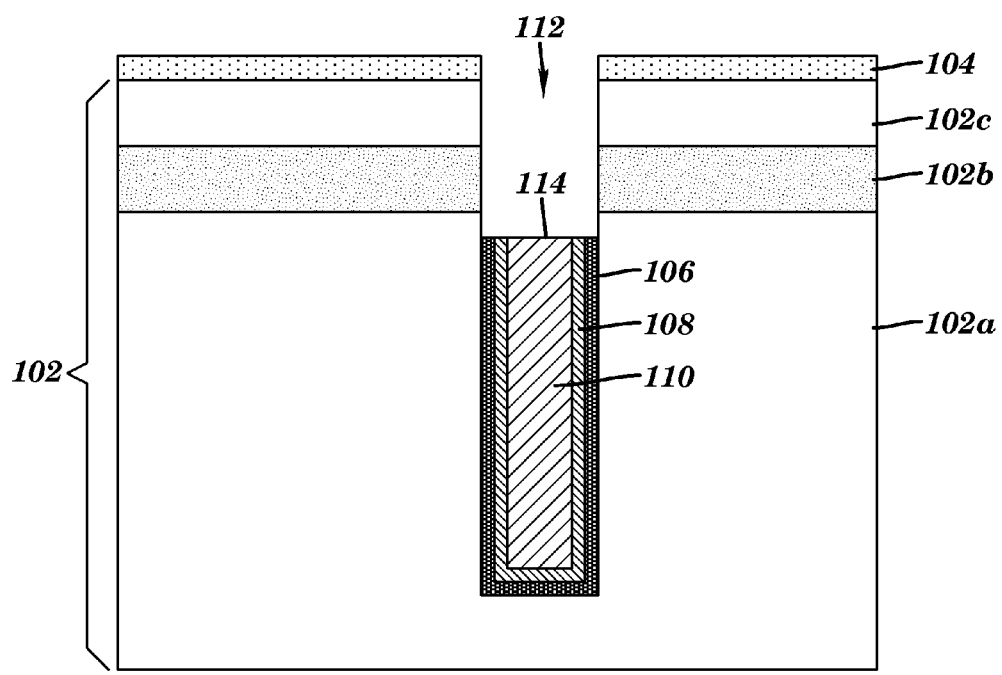

Referring now to FIG. 1B the node dielectric 106, the first conductive layer 108, and the second conductive layer 110 are then recessed to a predetermined depth within the base substrate 102a below the BOX layer 102b. However, although the exact depth is not critical, any depth below the BOX layer 102b may be sufficient. A conventional etch process such as, for example, plasma etch, reactive ion etch (RIE), or chemical downstream etch, can be used to recess the node dielectric 106, the first conductive layer 108, and the second conductive layer 110. An opening 112 is produced by the removal of the node dielectric 106, the first conductive layer 108, and the second conductive layer 110. In one particular embodiment, the node dielectric 106, the first conductive layer 108, and the second conductive layer 110 are recessed using a reactive ion etching (RIE) technique.

Figure 1C:
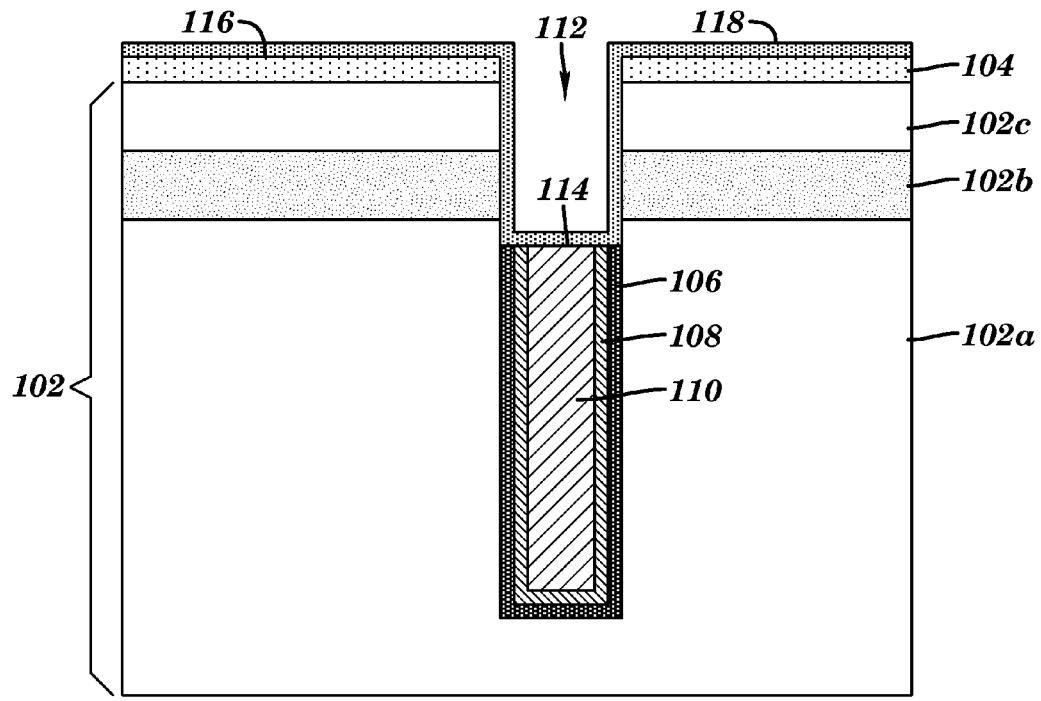

Now referring to FIG. 1C a spacer 118 may be deposited on a top surface 116 of the pad nitride layer 104 and a sidewall and a bottom 114 of the opening 112 (shown in FIG. 1B). The spacer 118 may include any suitable insulating material, including but not limited to thermal oxide, tetra ethyl ortho silicate, and high-k dielectric materials, or any suitable combination of these materials. The spacer 118 may be deposited by any suitable methods, including but not limited to, atomic layer deposition (ALD), chemical vapor deposition (CVD), low-pressure chemical vapor deposition (LPCVD), ultrahigh vacuum chemical vapor deposition (UHVCVD), metalorganic chemical vapor deposition (MOCVD), physical vapor deposition, sputtering, plating, evaporation, spin-on-coating, ion beam deposition, electron beam deposition, laser assisted deposition, and chemical solution deposition. In one embodiment, the spacer 118 may be made from a nitride deposited by an ALD process. The spacer 118 may have a thickness ranging from about 2 nm to 30 nm, although a thickness of the spacer 118 less than 2 nm or greater than 30 nm may be conceived. Preferably, the spacer 118 may have a thickness ranging from about 10 nm to 20 nm. The spacer 118 may be as thick as necessary to prevent a short circuit between the base substrate 102a and the first conductive layer 108.

Figure 1D:
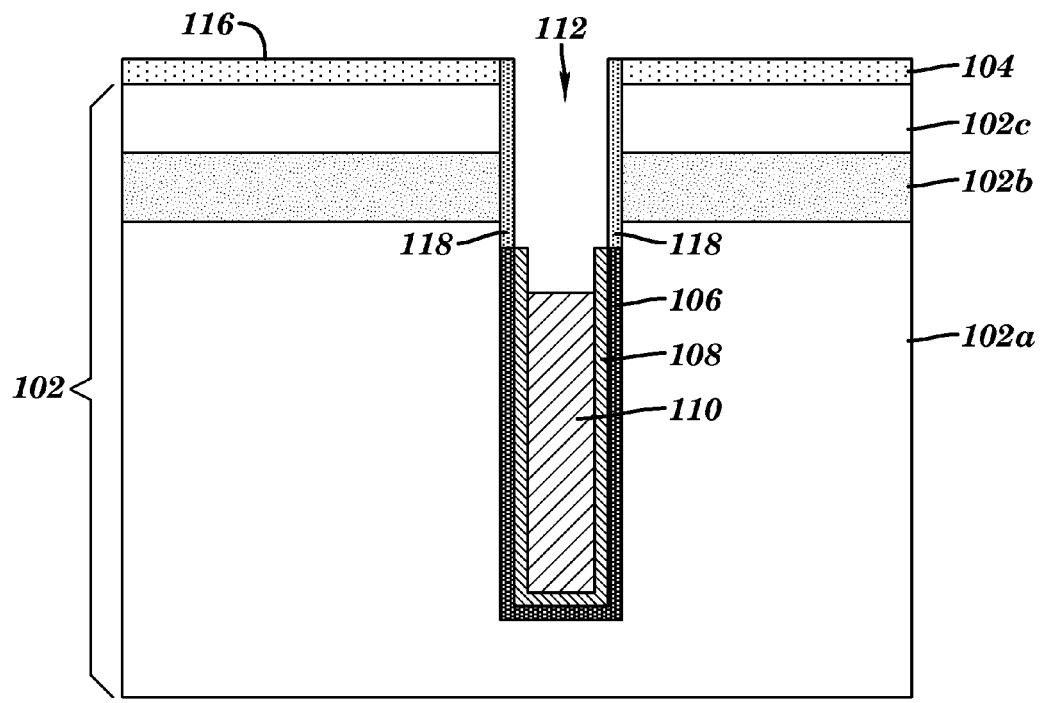

Referring now to FIG. 1D a portion of the spacer 118 may be removed from the bottom 114 (shown in FIG. 1C) of the opening 112. The removal process may further remove the spacer 118 from the top surface 116 of the pad nitride layer 104. Therefore, after completion of the removal process, the spacer 118 may only remain on the sidewall of the opening 112. Alternatively, any conventional etching process, for example plasma etch or chemical downstream etch may be used to remove the portion of the spacer 118. Furthermore, the removal process may also remove a portion of the first conductive layer 108. However, further removal of any portion of the first conductive layer 108 may neither be necessary nor critical. In one embodiment, a RIE process may be used to remove the spacer 118 from the bottom 114 (shown in FIG. 1C) of the opening 112.

Figure 1E:
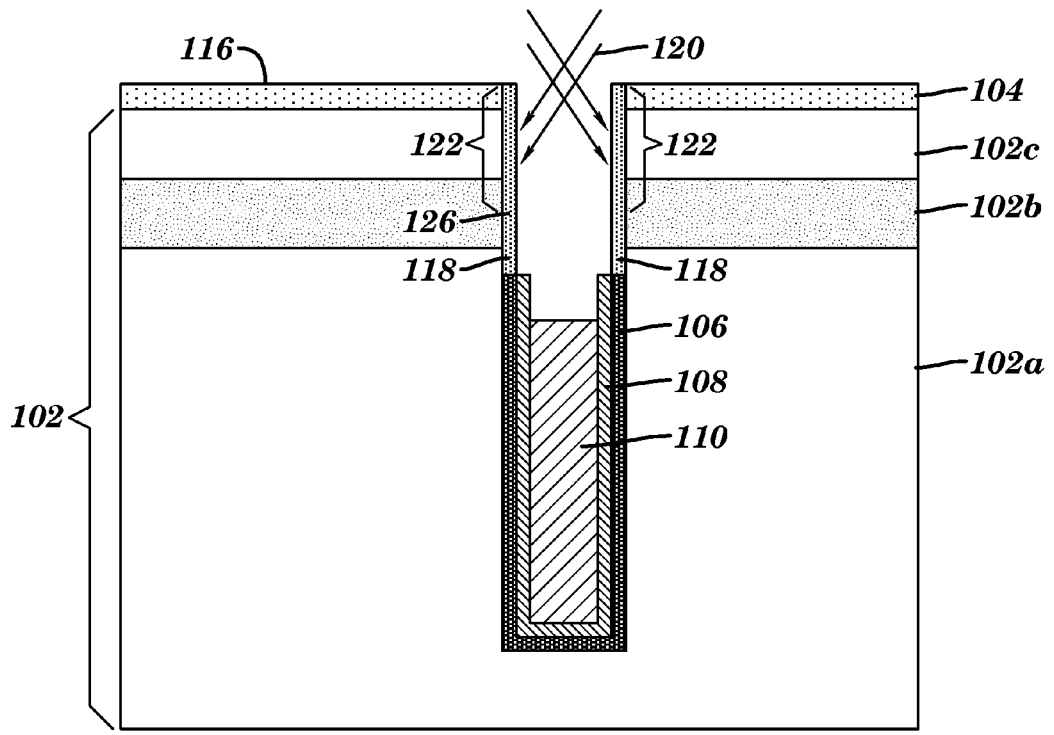

Referring now to FIG. 1E a process, as indicated by 120, may be performed on the spacer 118. The process 120 may be used for removing a portion 122 of the spacer 118. The portion 122 of the spacer 118 may be located adjacent to the sidewall of the opening 112 and extending from the top surface 116 of the pad nitride layer 104 to a reference point 126. In one embodiment, the process 120 can be an angled ion bombardment technique by which the portion 122 of the spacer 118 is removed by physical sputtering of high energy ions. In another embodiment, the process 120 can be an angled ion implantation technique by which ions are incorporated into the portion 122 of the spacer 118 and thus alter the film properties of the spacer 118. For example, defects can be introduced into the implanted film, rendering the implanted film more susceptible to removal by etching than the film without implantation. A removal technique may be required after the angled ion implantation process. In one embodiment, a wet etch process may be used to remove the portion 122 of the spacer 118 after the ion implantation technique. It may be noted that depending on the material properties and thickness of the spacer 118, and the dimensions of the opening 112, the species and conditions of the angled ion bombardment or ion implantation can be optimized to remove the portion 122 of the spacer 118 from the sidewalls of the opening 112 without undesirable damage to the sidewalls of the opening 112.

The ions in the process 120 may include, but are not limited to, argon, xenon, krypton, germanium, silicon, arsenic, phosphorus, antimony, boron, or indium, or some combination thereof. The ion energy ranges preferably from 5 KeV to 200 KeV, more preferably from 10 KeV to 100 KeV, and most preferably from 30 KeV to 50 KeV. The tilt angle of ion beam relative to the sidewall of the opening 112 ranges preferably from 3 degree to 60 degree, more preferably from 5 degree to 45 degree, and most preferably from 15 degree to 30 degree. The dose of the ions ranges preferably from 1E13/cm2 to 1E16/cm2, more preferably from 5E13/cm2 to 1E15/cm2, and most preferably 1E14/cm2 to 3E14/cm2.

Figure 1F:
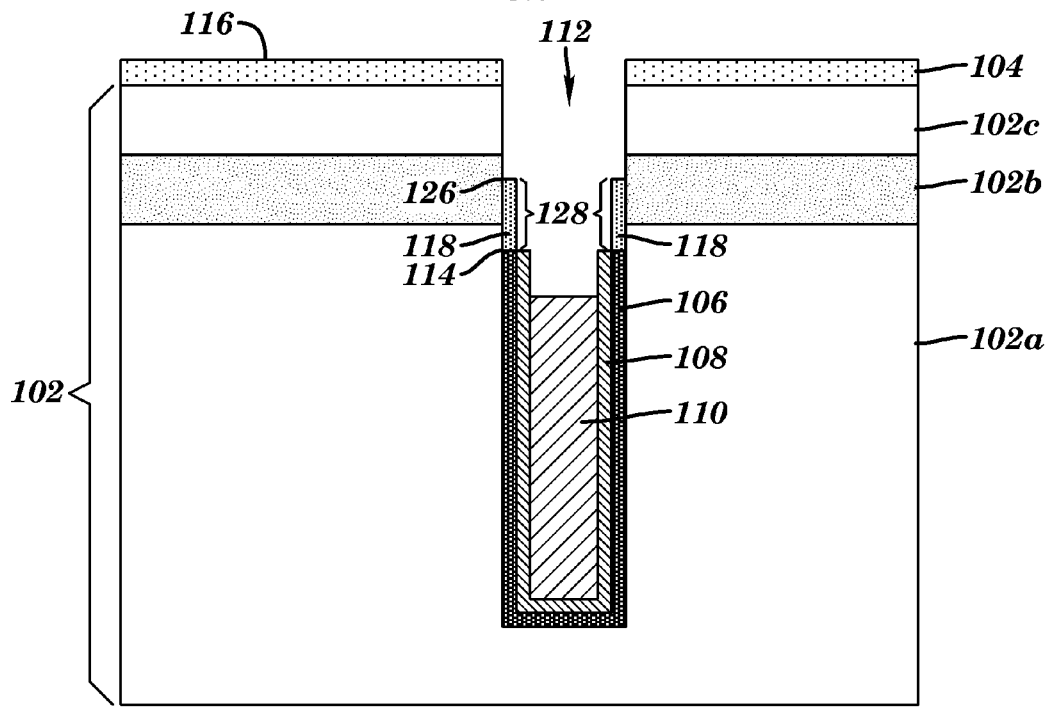

The portion 122 of the spacer 118 may extend along the sidewall of the opening from the top surface 116 of the pad nitride layer 104 to the reference point 126 within the BOX layer 102b. The reference point 126 may be anywhere within the BOX layer 102b. In one embodiment, as shown in FIG. 1F, the process 120 may be directed at the node dielectric 106 in multiple directions. In another embodiment the process 120 may be directed at the node dielectric 106 in only one direction.

Referring now to FIG. 1F the portion 122 of the spacer 118 (shown in FIG. 1E) has been removed leaving a remaining portion 128 of the spacer 118. The remaining portion 128 of the spacer 118 may be located adjacent to the sidewall of the opening 112 and extend from the reference point 126 to the bottom 114 of the opening 112. The reference point 126 may be situated within, but not above or below, the BOX layer 102b. The risk of a short circuit may be eliminated with the placement of the remaining portion 128 of the spacer 118 because a definitive barrier would insulate the base substrate 102a from the second conductive layer 110 and a third conductive layer 130 (shown in FIG. 1G). The precise recess depth of the node dielectric 106, the first conductive layer 108, and the second conductive layer 110 may no longer be critical to preventing a short circuit. Placement of the spacer 118 after recessing the node dielectric 106, the first conductive layer 108, and the second conductive layer 110 may reduce processing constraints while at the same time providing a more robust solution against the risk of short circuits.

In another embodiment, the spacer 118 may be a nitride film deposited by ALD and have a thickness ranging from about 10 nm to about 20 nm. An angled ion implantation of xenon with a tilt angle of 30 degrees, energy of 20 KeV, and a dose of 1E14/cm2 may be performed on the spacer 118. A wet etch process with an etchant containing hydrofluoric/ethylene glycol (HF/EG) can be performed to remove the portion 122 of the spacer 118 from the sidewalls of the opening 112 with minimal loss of the portion 128 of the spacer 118 and without undesirable damage to the sidewalls of the opening 112.

Figure 1G:
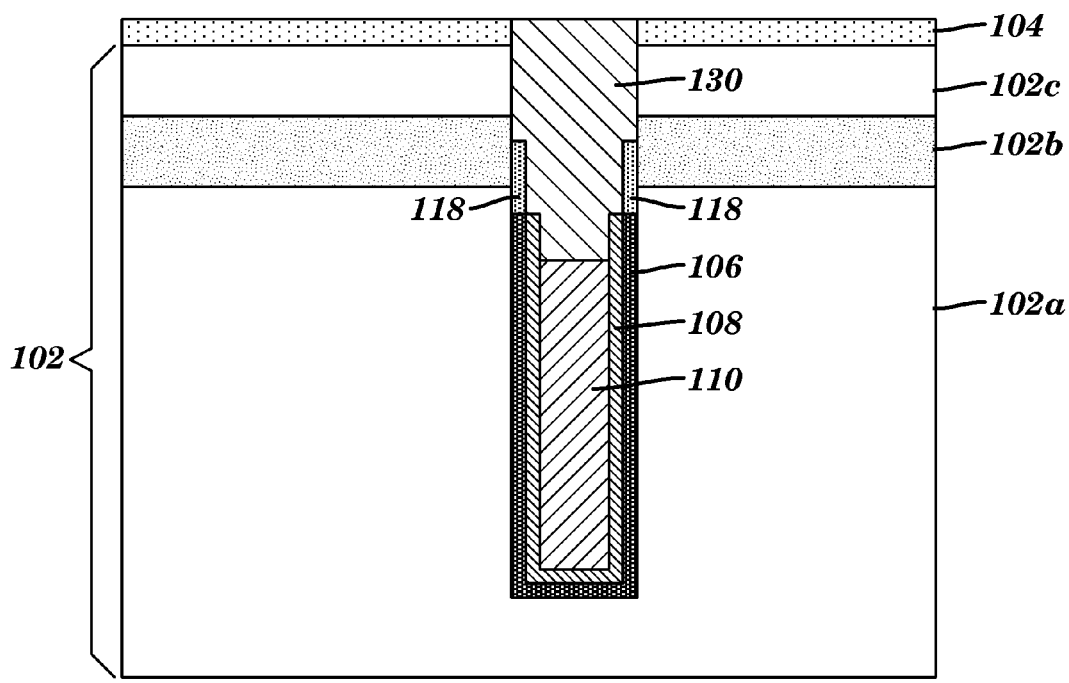

Referring now to FIG. 1G the third conductive layer 130 may be deposited within the opening 112 and adjacent to the spacer 118, the node dielectric 106, the first conductive layer 108, and the second conductive layer 110. The third conductive layer 130 may include any suitable conductive material, including but not limited to, doped polycrystalline or amorphous silicon, germanium, silicon germanium, a metal (e.g., tungsten, titanium, tantalum, ruthenium, zirconium), a conducting metallic compound material (e.g., tantalum nitride, titanium nitride, tungsten silicide, tungsten nitride, titanium nitride, tantalum nitride), carbon nanotube, conductive carbon, or any suitable combination of these materials. The third conductive layer 130 can be deposited by any suitable methods, including but not limited to, atomic layer deposition (ALD), chemical vapor deposition (CVD), low-pressure chemical vapor deposition (LPCVD), ultrahigh vacuum chemical vapor deposition (UHVCVD), metalorganic chemical vapor deposition (MOCVD), physical vapor deposition, sputtering, plating, evaporation, spin-on-coating, ion beam deposition, electron beam deposition, laser assisted deposition, and chemical solution deposition. In one particular embodiment, the third conductive layer 130 includes doped polysilicon deposited by LPCVD.

Figure 1H:
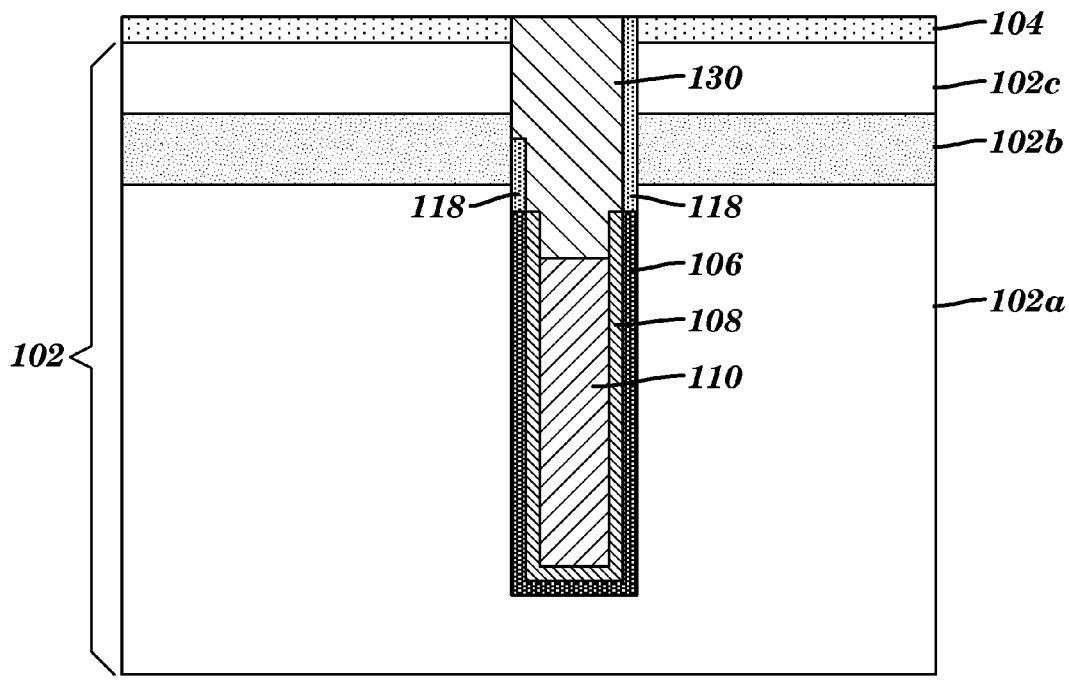
FIG. 1H depicts an improved spacer isolation in a deep trench according to one embodiment is shown.

Referring now to FIG. 1H an improved spacer isolation in a deep trench according to one embodiment is shown. In one embodiment, the process 120 may be directed at the node dielectric 106 in only one direction and the portion 122 of the spacer 118 may be removed from only one side of the deep trench, as shown in the figure.

Figure 1I:
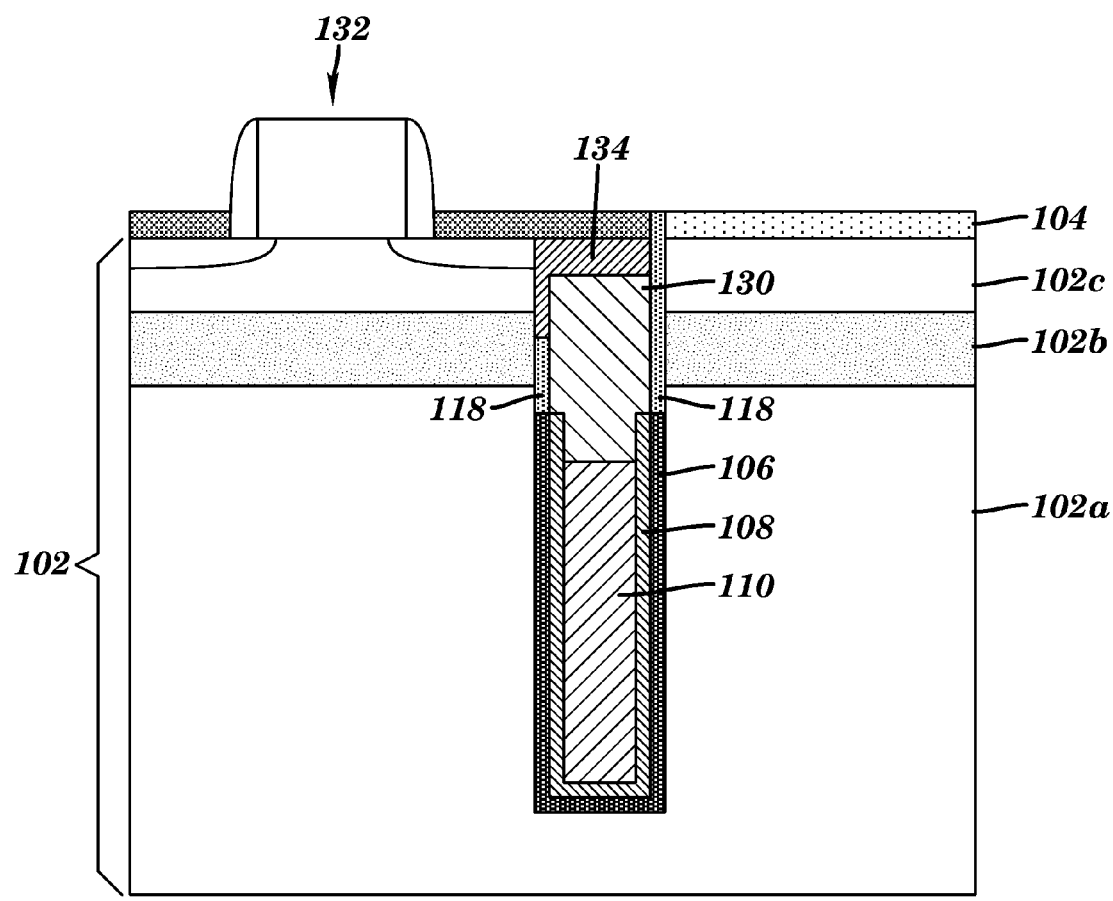
FIG. 1I depicts an improved spacer isolation in a deep trench according to one embodiment is shown.

Referring now to FIG. 1I an improved spacer isolation in a deep trench according to one embodiment is shown. The third conductive layer 130 may be electrically connected to a semiconductor device 132 via a conductive strap 134. Customary processing steps know to a person having ordinary skill in the art may be carried out to form the semiconductor device 132. In one embodiment, the semiconductor device 132 may include a field effect transistor. In one embodiment, the semiconductor device 132 and the deep trench structure may form a memory cell, such as, for example eDRAM.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

What is claimed is:

1. A structure comprising:
    a deep trench extending into a silicon-on-insulator (SOI) substrate, the deep trench comprising a sidewall, a top, and a bottom;
    a node dielectric located entirely below a buried oxide layer of the SOI substrate and adjacent to the sidewall and the bottom of the deep trench;
    a first conductive layer located directly on top of the node dielectric;
    a second conductive layer located directly on top of the first conductive layer, the second conductive layer filling the deep trench to a level at or below the first conductive layer;
    a spacer located along the sidewall of the deep trench and extending from a location between a top surface and a bottom surface of the buried oxide layer to the node dielectric located below the buried oxide layer; and
    a third conductive layer located on top of the first conductive layer, the second conductive layer, and the spacer, the third conductive layer filling the deep trench to a level equal with the top of the deep trench.

2. The structure of claim 1, wherein the node dielectric comprises oxide, nitride, oxynitride, or high-k dielectric.

3. The structure of claim 1, wherein the first conductive layer, the second conductive layer, and the third conductive layer comprises polycrystalline, silicon, amphorous silicon, germanium, silicon germanium, metals, conducting metallic compound materials, carbon nanotube, or conductive carbon.

4. The structure of claim 1, wherein the spacer comprises a nitride.

5. The structure of claim 1, wherein the spacer comprises thermal oxide, tetra ethyl ortho silicate, or high-k dielectric materials.

6. The structure of claim 1, where in the spacer comprises a thickness ranging from 10 nm to 20 nm.

7. The structure of claim 1, further comprising:
    a semiconductor device formed in the SOI substrate adjacent to the deep trench; and
    a conductive strap electrically connecting the third conductive layer to the semiconductor device.

8. The structure of claim 1, wherein the SOI substrate comprises a SOI layer, the buried oxide layer, and a base substrate layer, the buried oxide layer being located on top of the base substrate layer, and the SOI layer being located on top of the buried oxide layer.

9. A structure comprising:
    a deep trench extending into a silicon-on-insulator (SOI) substrate, the deep trench comprising a sidewall, a top, and a bottom;
    a node dielectric located entirely below a buried oxide layer of the SOI substrate and adjacent to the sidewall and the bottom of the deep trench; and
    a spacer located along the sidewall of the deep trench and extending from a location between a top surface and a bottom surface of the buried oxide layer to the node dielectric located below the buried oxide layer.

10. The structure of claim 9, further comprising:
    a conductive material on top of the node dielectric, on top of the spacer, and filling the deep trench, the spacer electrically insulating the conductive material from a portion of the SOI substrate located below the buried oxide layer.

11. The structure of claim 9, wherein the node dielectric comprises oxide, nitride, oxynitride, or high-k dielectric.

12. The structure of claim 9, wherein the conductive material comprises polycrystalline, silicon, amphorous silicon, germanium, silicon germanium, metals, conducting metallic compound materials, carbon nanotube, or conductive carbon.

13. The structure of claim 9, wherein the spacer comprises a nitride.

14. The structure of claim 9, wherein the spacer comprises thermal oxide, tetra ethyl ortho silicate, or high-k dielectric materials.

15. The structure of claim 9, further comprising:
   a semiconductor device formed in the SOI substrate adjacent to the deep trench; and
   a conductive strap electrically connecting the conductive material to the semiconductor device.

16. The structure of claim 9, wherein the SOI substrate comprises a SOI layer, the buried oxide layer, and a base substrate layer, the buried oxide layer being located on top of the base substrate layer, and the SOI layer being located on top of the buried oxide layer.

17. A structure comprising:
   a deep trench extending into a silicon-on-insulator (SOI) substrate, the deep trench comprising a sidewall, a top, and a bottom;
   a node dielectric located entirely below a buried oxide layer of the SOI substrate and adjacent to the sidewall and the bottom of the deep trench;
   a first spacer located along the sidewall of the deep trench, the spacer extending from the top of the deep trench to the node dielectric located below the buried oxide layer along one portion of the sidewall, and a second spacer extending from a location between a top surface and a bottom surface of the buried oxide layer to the node dielectric located below the buried oxide layer along another portion of the sidewall;
   a conductive material on top of the node dielectric, on top of the spacer, and filling the deep trench, the spacer electrically insulating the conductive material from a portion of the SOI substrate located below the buried oxide layer;
   a semiconductor device formed in the SOI substrate adjacent to the deep trench; and
   a conductive strap electrically connecting the conductive material of the deep trench to the semiconductor device.

18. The structure of claim 17, wherein the conductive material comprises polycrystalline, silicon, amphorous silicon, germanium, silicon germanium, metals, conducting metallic compound materials, carbon nanotube, or conductive carbon.

19. The structure of claim 17, wherein the spacer comprises a nitride.

20. The structure of claim 17, wherein the spacer comprises thermal oxide, tetra ethyl ortho silicate, or high-k dielectric materials.

* * * * *